US010535809B1

(12) United States Patent
Vodrahalli

(10) Patent No.: US 10,535,809 B1
(45) Date of Patent: Jan. 14, 2020

(54) SUBSTRATE MATERIALS FOR QUANTUM PROCESSORS

(71) Applicant: Rigetti & Co, Inc., Berkeley, CA (US)

(72) Inventor: Nagesh Vodrahalli, Los Altos, CA (US)

(73) Assignee: Rigetti & Co, Inc., Berkeley, CA (US)

( * ) Notice: Subject to any disclaimer, the term of this patent is extended or adjusted under 35 U.S.C. 154(b) by 0 days.

(21) Appl. No.: 16/116,481

(22) Filed: Aug. 29, 2018

Related U.S. Application Data

(60) Provisional application No. 62/552,128, filed on Aug. 30, 2017.

(51) Int. Cl.
*H01L 39/22* (2006.01)
*H01L 39/02* (2006.01)
*G06N 10/00* (2019.01)

(52) U.S. Cl.
CPC .......... *H01L 39/223* (2013.01); *G06N 10/00* (2019.01); *H01L 39/025* (2013.01)

(58) Field of Classification Search
CPC ...... H01L 39/223; H01L 39/025; G06N 10/00
See application file for complete search history.

(56) References Cited

U.S. PATENT DOCUMENTS 9,836,699 B1 * 12/2017 Rigetti .................. H01L 39/223
9,892,365 B2 2/2018 Rigetti et al.
9,893,262 B2 2/2018 Thompson et al.
9,971,970 B1 5/2018 Rigetti et al.
10,068,181 B1 9/2018 Rigetti et al.
2014/0274725 A1 * 9/2014 Abraham ............. H01L 39/223
505/170

FOREIGN PATENT DOCUMENTS

WO 2015/178991 11/2015

OTHER PUBLICATIONS

Anstie et al. ("Characterization of a Spherically Symmetric Fused-Silica-Loaded Cavity Microwave Resonator," Measurement Science and Technology, 14, pp. 286-293, 2003) (Year: 2003).*
Geyer et al. ("Dielectric Properties of Materials at Cryogenic Temperatures and Microwave Frequencies," Proceedings of Conference on Precision Electromagnetic Measurements, pp. 350-351, Jun. 27-Jul. 1, 1994) (Year: 1994).*

(Continued)

*Primary Examiner* — Yasser A Abdelaziez
(74) *Attorney, Agent, or Firm* — Henry Patent Law Firm PLLC

(57) ABSTRACT

In a general aspect, an integrated microwave circuit is disclosed for processing quantum information. The integrated microwave circuit includes a substrate having a first surface and a second surface opposite the first surface. The substrate is formed of a silicon oxide material having a loss tangent no greater than $1\times10^{-5}$ at cryogenic temperatures at or below 120 K. The integrated microwave circuit also includes qubit circuitry disposed on the first surface that includes a Josephson junction. A ground plane is disposed on the first surface or the second surface. In some variations, the silicon oxide material is fused silica. In other variations, the silicon oxide material is crystalline quartz.

34 Claims, 7 Drawing Sheets

(56) References Cited

OTHER PUBLICATIONS

"Fused quartz", Wikipedia, https://en.wikipedia.org/w/index.php?title=Fused_quartz&oldid=789324975, Jul. 6, 2017, 5 pgs.
"Fused Silica, SiO2 Glass Properties", http://accuratus.com/fused.html; retrieved Jul. 28, 2017, 2 pgs.
"Properties of fused silica", https://www.heraeus.com/en/hqs/fused_silica_quartz_knowledge_base/properties/properties.aspx, retrieved Jul. 28, 2017, 9 pgs.
"Synthetic Sapphira vs. Glass, Fused Quartz & Silica", Rayotek Scientific Inc., https://rayotek.com/tech-specs/material-comparisons.htm, retrieved Jun. 11, 2017, 4 pgs.
Baker-Jarvis, et al., "Dielectric and Conductor-Loss Characterization and Measurements on Electronic Packaging Materials", NIST Technical Note 1520, U.S. Dept of Commerce, Jul. 2001, 160 pgs.
Li, et al., "Improvements in Silicon Oxide Dielectric Loss for Superconducting Microwave Detector Circuits", IEEE Transactions on Applied Superconductivity, vol. 23, No. 3, Jun. 2013, 4 pgs.
Westphal, et al., "Dielectric Constant and Loss Data", AD746686, Technical Report AFML-TR-72-39, Air Force Materials Laboratory, Air Force Systems Command, Wright-Patterson Air Force Base, Ohio, Apr. 1972, 243 pgs.
Zhang, et al., "Measurement of dielectric loss tangent at cryogenic temperature using superconducting film resonator", Springer Link, Journal of Theoretical and Applied Physics, vol. 10, Issue 1, pp. 27-32, Mar. 2016, 14 pgs.

\* cited by examiner

SUBSTRATE MATERIALS FOR QUANTUM PROCESSORS

BACKGROUND

The following description relates to substrate materials for quantum processors.

In some quantum information processing architectures, qubits are implemented in microwave integrated circuits. For example, qubits can be implemented in circuit devices that include Josephson junctions formed on a substrate. Some conventional systems use a silicon crystal substrate for microwave integrated circuits.

DETAILED DESCRIPTION

In some aspects of what is described here, fused silica, fused quartz, or crystalline quartz can be used to fabricate quantum processor components. For example, a microwave integrated circuit in a quantum processor can be formed on a fused silica substrate, a fused quartz substrate, a crystalline quartz substrate, or another type of low-loss $SiO_2$ substrate.

Microwave integrated circuits for quantum information processing typically include Josephson junctions and microwave sensing circuitry, all designed to operate at low temperatures (e.g., below 1 K or another cryogenic temperature). The microwave sensing circuitry can include, for example, resonators, capacitors, inductors, and other types of microwave circuit devices. Fused silica or fused quartz can be selected as the substrate material for all or part of a microwave integrated circuit, for example, to improve or optimize Josephson junction performance or microwave sensing circuitry performance (or both), and to provide good thermomechanical and electrical properties. These and potentially other advantages may be achieved, in some cases, due to certain material properties (e.g., high electrical resistivity, low loss tangent for microwave frequencies, low thermal expansion coefficient, etc.) exhibited by fused silica and fused quartz substrates.

In some cases, through-substrate vias can be formed in fused silica and fused quartz substrates, for example, to enable stacked devices, to provide 3D integration for high-density devices, or to allow for flexibility in heterogeneous substrate integration. In some cases, such through-substrate vias can be metallized with exclusively superconducting materials or a combination of superconducting and non-conducting materials, to provide a substantial superconducting path below critical temperatures. Examples of superconducting materials that can be used include aluminum (Al), molybdenum (Mo), niobium (Nb), niobium nitride (NbN), molybdenum rhenium alloys (Mo—Re), titanium nitride (TiN), indium (In), tantalum nitride (TaN), and others.

In some cases, the qubit circuitry and microwave sensing circuitry that make up one or more quantum processor devices (e.g., qubit device, coupler device, quantum parametric amplifier, etc.) can be fabricated on the same side of a single fused silica or fused quartz substrate. In some cases, the qubit circuitry and microwave sensing circuitry that make up one or more devices can be separated on opposite sides of the same fused silica or fused quartz substrate, or on multiple distinct substrates. In addition, fused silica and fused quartz substrates are available in different thicknesses, and the substrate thickness can be selected for a particular application. In some examples, the substrate thickness is in the range of 20 micrometers ($\mu m$) to 740 $\mu m$; in the range of 100 $\mu m$ to 500 $\mu m$; or in the range of 250 $\mu m$ to 325 $\mu m$.

Figure 5:
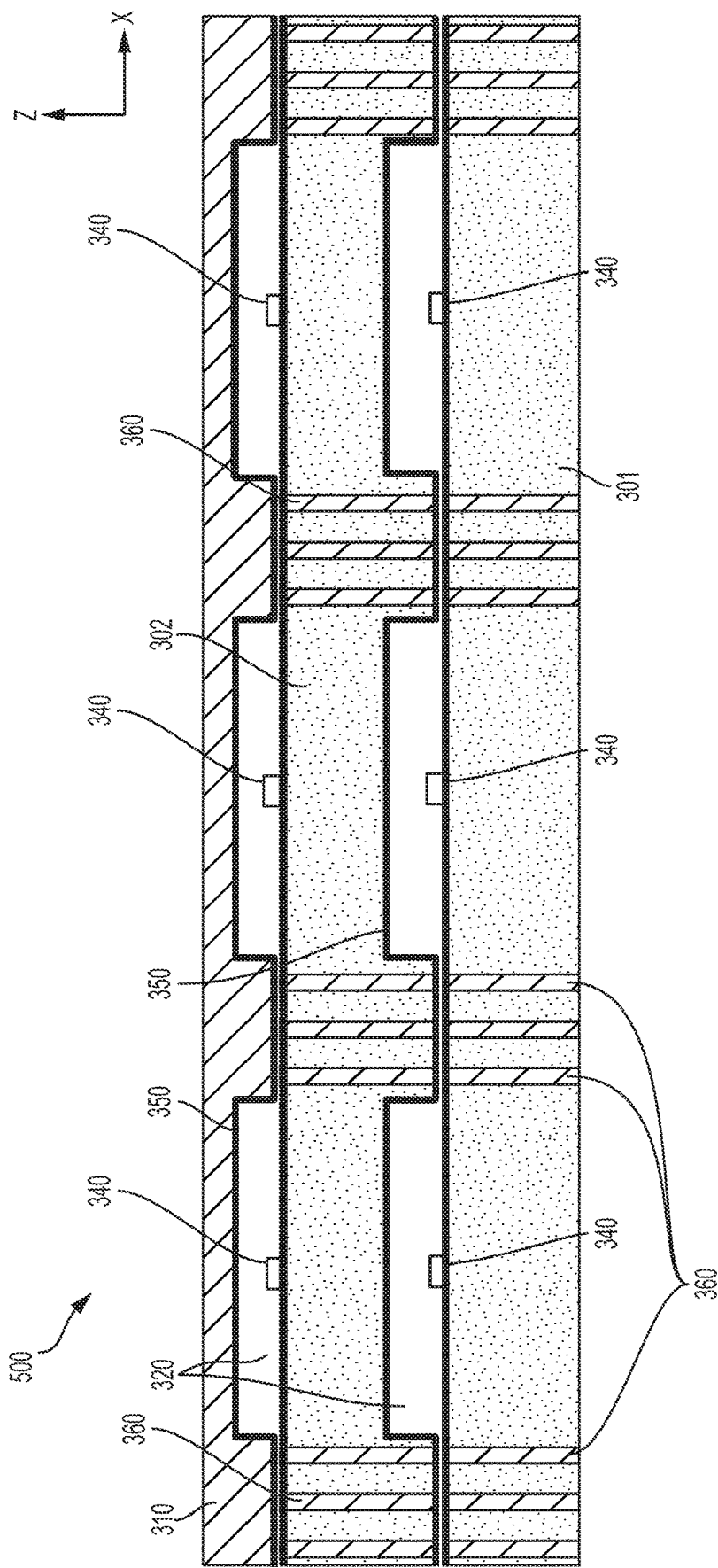
FIG. 5 is a cross-section view of an example integrated circuit system.
Figure 6:
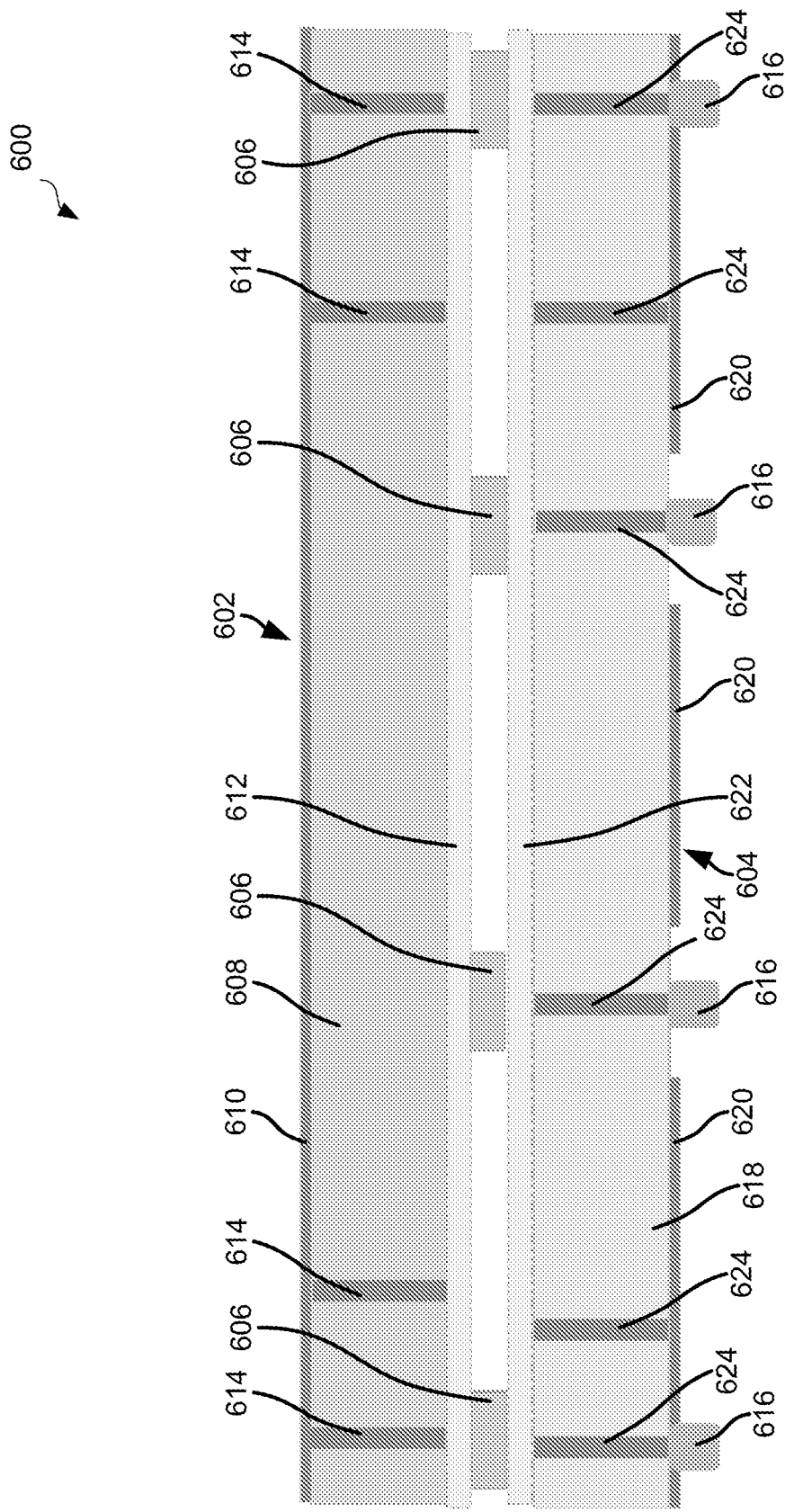
FIG. 6 is a cross-section view of an example integrated circuit system.
Figure 7:
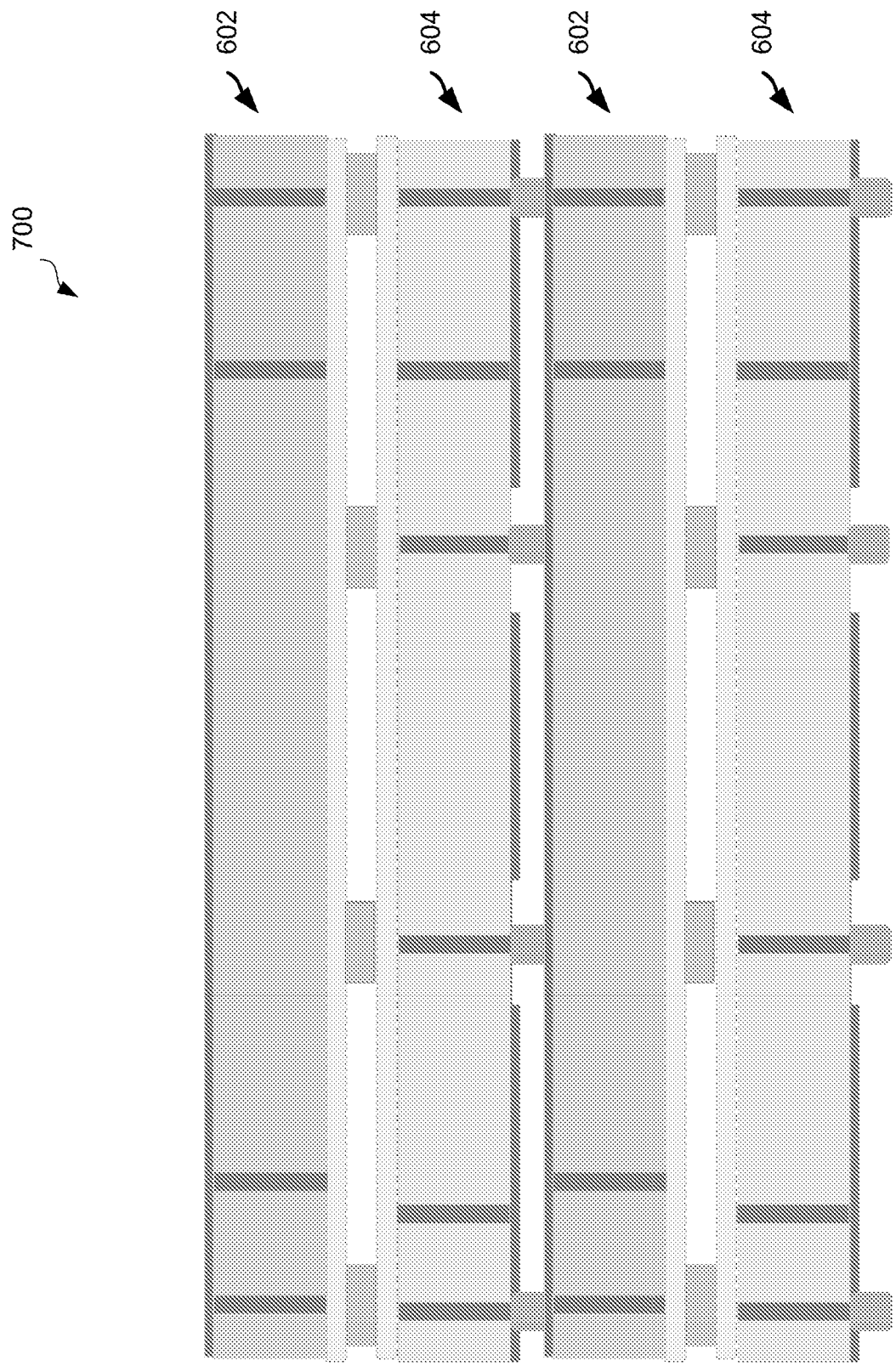
FIG. 7 is a cross-section view of an example integrated circuit system.

When distinct types of circuit components (e.g., the qubit circuitry and microwave sensing circuitry) are fabricated on distinct substrates, the same type of material can be used for each substrate, or different types of material may be used for distinct substrates. In the "homogeneous" substrate case, multiple substrates of fused silica or fused quartz can be stacked, for example, as shown in FIG. 5. In the "heterogeneous" substrate case, the microwave sensing circuitry can be fabricated on a fused silica or fused quartz substrate, and the Josephson junction circuitry can be fabricated on another type of substrate (e.g., a silicon or sapphire crystal substrate). The substrates can be stacked, for example, as shown in FIGS. 6-7. In each of these cases, through-substrate vias can provide microwave isolation between circuitries. The substrates can be bonded, for example, by thermocompression bonding, reflow solder bonding, flip-chip solder bonding, or another stack bonding technique. The bonding process can be implemented in a manner that maintains separation between circuitry layers; for example, in the "heterogeneous" or "homogeneous" substrate cases, the bonding process can maintain separation between the sensing circuitry and qubit circuitry on different layers.

By using one type of substrate material for certain circuit components (e.g., Josephson junctions) and another type of substrate material for other circuit components (e.g., microwave sensing circuitry), the substrate material may be adapted or optimized for individual components. For instance, fused silica and fused quartz substrates could potentially provide advantages for Josephson junctions, while another type of substrate material could provide advantages for another type of circuit component. Such "heterogenus" substrate implementations may also allow for improving or optimizing respective fabrication processes while reducing or minimizing cross contamination risks (e.g., between the Josephson junction processing and the microwave sensing circuitry processing).

Fused silica and fused quartz are both amorphous or glass forms of silicon dioxide ($SiO_2$). Such fused forms of silicon dioxide ($SiO_2$) may be produced by a process that includes heating silicon dioxide material beyond a critical temperature (e.g., 1550° C.) and then quench cooling the material to form an amorphous or glass state. Crystalline quartz includes crystalline forms of $SiO_2$, which has a crystalline structure.

Low-loss $SiO_2$ substrates can be made of fused silica and fused quartz (or other low-loss $SiO_2$ materials such as crystalline quartz) and used to produce quantum information processing systems. At cryogenic temperatures, fused silica and fused quartz substrates have several material properties that can be advantageous for quantum processor devices and generally for quantum information processing applications.

Fused silica and fused quartz substrates can be excellent insulators, having high electrical resistance, amenable to fabrication of Josephson junctions; for example, high-purity fused silica at room temperature has resistivity greater than $10^{15}$ Ohm·cm, and by extrapolation, high-purity fused silica at cryogenic temperatures is expected to have resistivity greater than $10^{18}$ Ohm·cm. Fused silica and fused quartz substrates can also have a low loss tangent, which indicates superior dielectric properties; for example, over frequencies ranging from a few MHz to over 26 GHz, the loss tangent is on the order of $10^{-5}$ to $10^{-4}$ at room temperature and on the order of $10^{-7}$ to $10^{-6}$ at cryogenic temperatures. Many quantum processor devices operate in a frequency range (e.g., between 3 and 10 GHz) that benefits from the low loss tangent of these materials, which suggests that fused silica and fused quartz may have attractive or even ideal microwave properties for such quantum processor devices. Fused silica and fused quartz substrates can also have a very low thermal expansion coefficient and hence high resistance to thermal shock; for example, fused silica may have a thermal expansion coefficient on the order of $0.5 \cdot 10^{-6}/°$ C. Fused silica and fused quartz substrates can also have a low dielectric constant; for example, at radio and microwave frequencies of interest for quantum computing, fused silica may have a dielectric constant of 3.8, which is less than (by about ⅓) the dielectric constant for silicon crystal substrates. The lower dielectric constant can help with microwave energy containment or conservation. Accordingly, fused silica and fused quartz could potentially be an advantageous or ideal substrate for Josephson junctions and other circuitry in quantum processor devices. Moreover, fused silica and fused quartz substrates are typically homogenous, unlike silicon substrates that form interfaces between Si and $SiO_2$. In some cases, crystalline quartz substrates may have properties that are similar to the properties of fused silica and fused quartz materials described above.

Accordingly, in some cases, low-loss $SiO_2$ materials have higher resistivity, lower dielectric constant, lower thermal expansion coefficient, or lower loss tangent (or a combination of some or all these advantages), compared to conventional substrate materials such as a silicon or sapphire crystal, in the electromagnetic frequency range and at the operating temperature of a superconducting quantum processor. For example, sapphire and silicon crystals are believed to have a higher dielectric constant and a higher loss tangent than low-loss $SiO_2$ substrates under operating conditions of a quantum processor. For reference, sapphire has the dielectric constant of 9-10 and loss tangent around $10^{-4}$ at room temperature at frequencies of interest.

In some instances, low-loss $SiO_2$ materials (and low-loss $SiO_2$ substrates) have dielectric constant in the range of 1 to 5 and loss tangent less than $10^{-7}$ at cryogenic temperatures. In some instances, low-loss $SiO_2$ materials (and low-loss $SiO_2$ substrates) have dielectric constant less than 9 and loss tangent less than $10^{-6}$ at cryogenic temperatures. In some instances, low-loss $SiO_2$ materials (and low-loss $SiO_2$ substrates) have dielectric constant less than 13 and loss tangent less than $10^{-5}$ at cryogenic temperatures.

Figure 1:
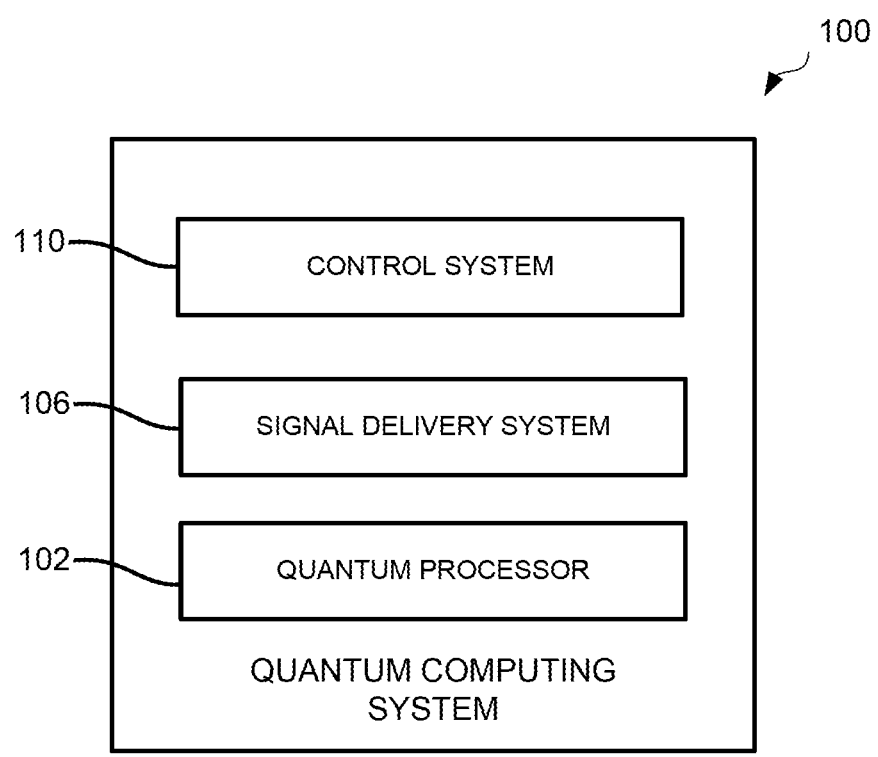
FIG. 1 is a bock diagram of an example quantum computing system.

FIG. 1 is a schematic diagram of an example quantum computing system 100. The example quantum computing system 100 shown in FIG. 1 includes a control system 110, a signal delivery system 106, and a quantum processor 102. A quantum computing system may include additional or different features, and the components of a quantum computing system may operate as described with respect to FIG. 1 or in another manner.

The example quantum computing system 100 shown in FIG. 1 can perform quantum computational tasks by executing quantum algorithms. In some implementations, the quantum computing system 100 can perform quantum computation by storing and manipulating information within individual quantum states of a composite quantum system. For example, qubits (i.e., quantum bits) can be stored in and represented by an effective two-level sub-manifold of a quantum coherent physical system. Control signals can manipulate the quantum states of individual qubits and the joint states of multiple qubits. In some instances, conditional quantum logic can be performed in a manner that allows large-scale entanglement within the quantum processor 102. In some instances, information can be read out from the composite quantum system by measuring the quantum states of the individual qubits.

The quantum computing system 100 can operate using a gate-based model, an adiabatic model or another type of model for quantum computing. In some implementations, the quantum computing system 100 is constructed and operated according to a scalable quantum computing architecture. For example, in some cases, the architecture can be scaled to a large number of qubits to achieve a large-scale general purpose coherent quantum computer. In some instances, the architecture is adaptable and can incorporate a variety of modes for each technical component. For example, the architecture can be adapted to incorporate different types of qubit devices, coupler devices, resonator devices, readout devices, signaling devices, etc.

The example quantum processor 102 shown in FIG. 1 includes qubit devices that are used to store and process quantum information. In some instances, all or part of the quantum processor 102 functions as a quantum information processor, a quantum memory, or another type of subsystem. The quantum processor 102 shown in FIG. 1 may include, for example, any of the integrated circuit systems shown in FIGS. 2, 3, 4, 5, 6, and 7, or another type of system.

In some implementations, the quantum processor 102 includes one or more microwave integrated circuits that include multiple quantum circuit devices. For instance, qubits can be defined in respective qubit devices that each include one or more Josephson junctions, superconducting quantum interference device (SQUID) loops, or other features. The microwave integrated circuits and constituent quantum circuit devices can be defined on one or more substrates. For example, the microwave integrated circuitry may be defined on one or more fused silica substrates, fused quartz substrates, or substrates of another material.

Figure 2:
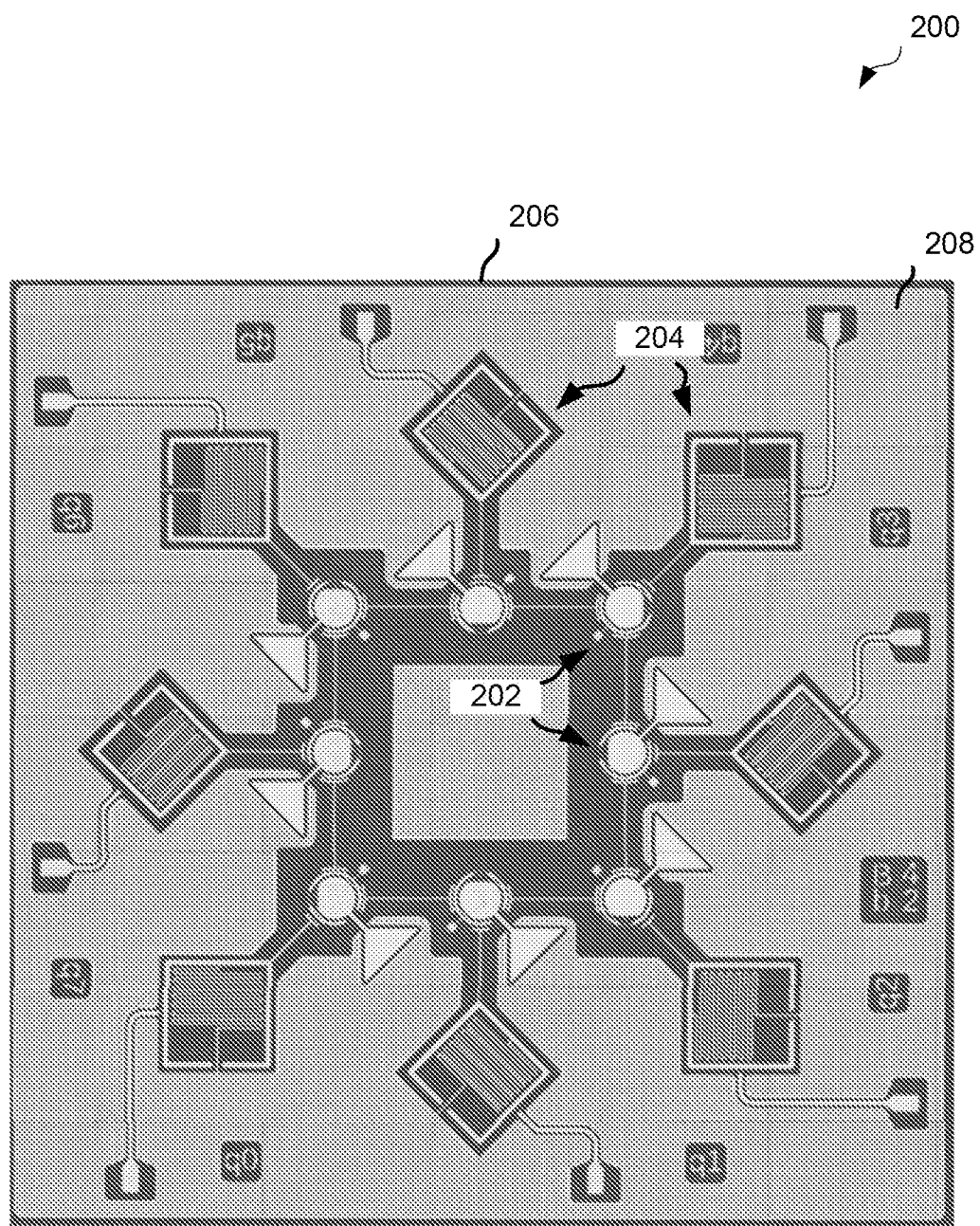
FIG. 2 is a top view of an example integrated circuit system.
Figure 3:
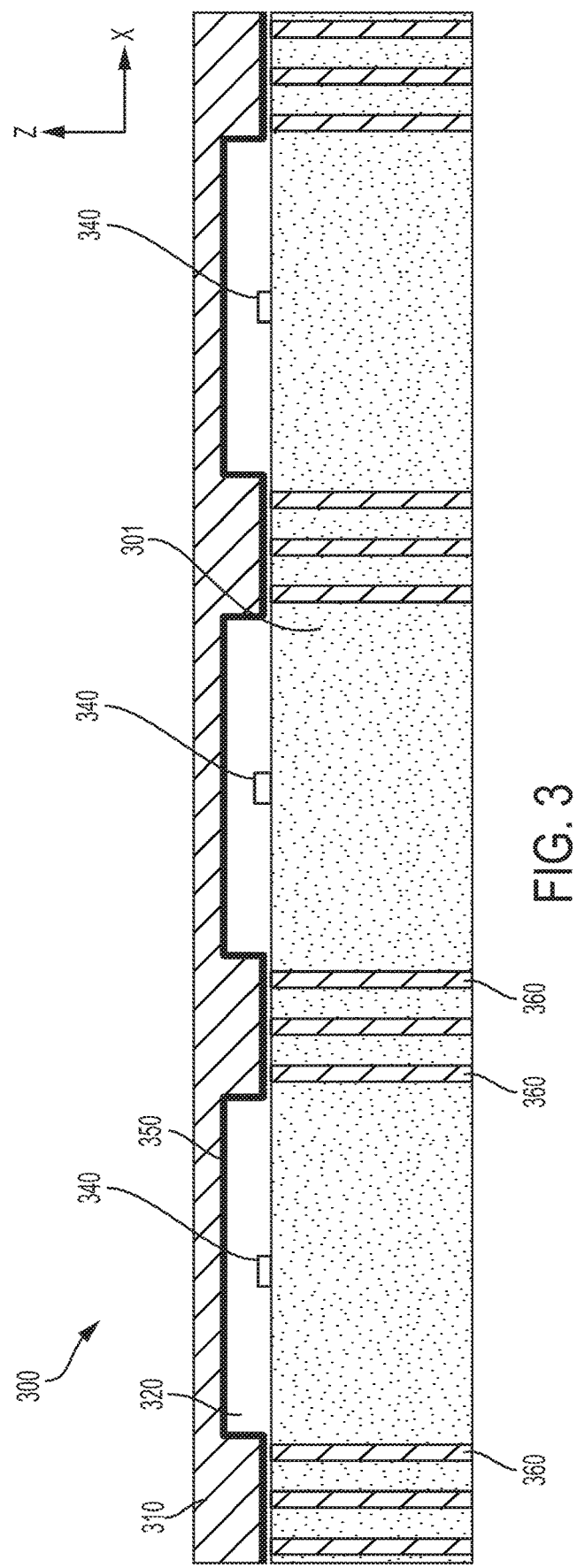
FIG. 3 is a cross-section view of an example integrated circuit system.
Figure 4:
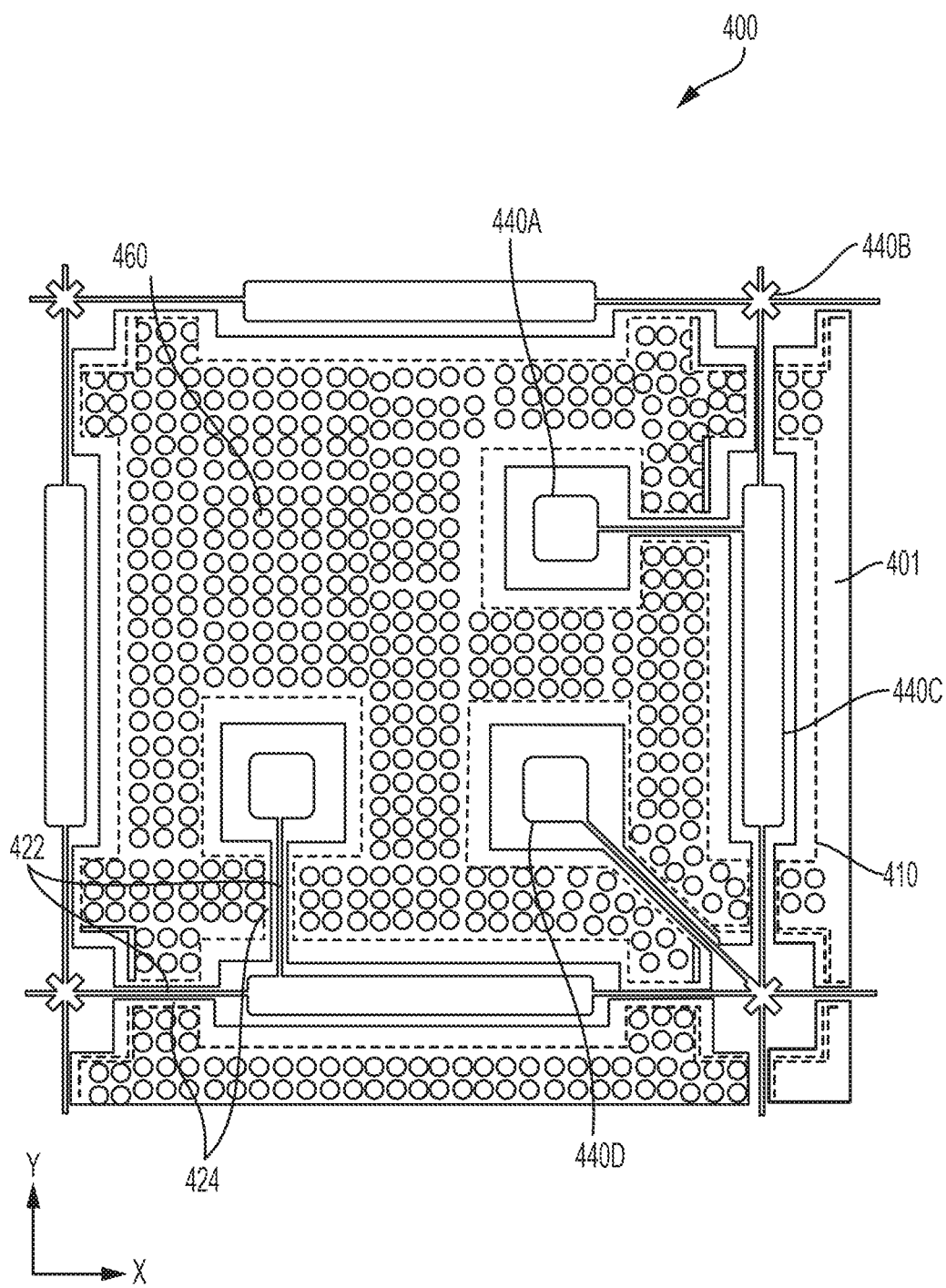
FIG. 4 is a top view of an example integrated circuit system.

In some implementations, the quantum circuit system 102 includes a two-dimensional or three-dimensional device array, which includes devices arranged in a lattice structure. For instance, a two-dimensional device array can be formed on a two-dimensional substrate (e.g., a fused silica or fused quartz substrate), where the devices (e.g., qubit devices) are arranged in a two-dimensional lattice structure and configured to communicate with one another. FIGS. 2, 3, and 4 show examples where devices are arranged in a two-dimensional array. A three-dimensional device array can be formed by a stack of two-dimensional substrates, where the devices are arranged in a three-dimensional lattice structure and configured (e.g., by superconducting through-vias defined in the substrates) to communicate with one another. FIGS. 5, 6, and 7 show examples where devices are arranged in a three-dimensional array. In some cases, multiple different types of substrate materials are used. For example, fused silica or fused quartz substrates may be used for one or more layers in a stacked architecture, while silicon or another material substrate may be used for another layer.

In the example quantum processor 102, the qubit devices each store a single qubit (a bit of quantum information), and the qubits can collectively define the computational state of a quantum information processor or quantum memory. The quantum processor 102 may also include readout devices that selectively interact with the qubit devices to detect their quantum states. For example, readout resonators may be configured to produce readout signals that indicate a computational state of the quantum processor or quantum memory. The quantum processor 102 may also include coupler devices that selectively operate on individual qubits or pairs of qubits. For example, the coupler devices may produce entanglement or other multi-qubit states over two or more qubits in the quantum processor 102.

In some implementations, the example quantum processor 102 can process the quantum information stored in the qubits by applying control signals to the qubit devices or to other devices housed in the quantum processor. For example, a sequence of operations can be applied to the qubits to perform a quantum algorithm. The quantum algorithm may correspond to a computational task, a quantum error correction procedure, a quantum state distillation procedure, or a combination of these and other types of operations.

In the example shown in FIG. 1, the signal delivery system 106 provides communication between the control system 110 and the quantum processor 102. For example, the signal delivery system 106 can receive control signals from the control system 110 and deliver the control signals to the quantum processor 102. In some instances, the signal delivery system 106 performs preprocessing, signal conditioning, or other operations to the control signals before delivering them to the quantum processor 102. The signal delivery system 106 may also receive readout signals or other signals from the quantum processor 102 and deliver the signals to the control system 110.

In some implementations, the signal delivery system 106 includes input and output processing hardware, input and output connections, and other components. The input and output processing hardware may include, for example, filters, attenuators, directional couplers, multiplexers, diplexers, bias components, signal channels, isolators, amplifiers, power dividers and other types of components. In some implementations, the signal delivery system 106 provides connections between different temperature and noise regimes. For example, the quantum computing system 100 may include a series of temperature stages between a higher temperature regime of the control system 110 and a lower temperature regime of the quantum processor 102.

In the example quantum computing system 100 shown in FIG. 1, the control system 110 controls operation of the quantum processor 102. The example control system 110 may include data processors, signal generators, interface components and other types of systems or subsystems. In some cases, the control system 110 includes one or more classical computers or classical computing components. For example, a classical computing system can be configured to compile instructions (e.g., control signals or sets of control signals) for the quantum processor 102. The control system 110 can generate control signals that are communicated to the quantum processor 102 by the signal delivery system 106, and the devices in the quantum processor 102 can execute operations in response to the control signals.

In some cases, the control system 110 includes a microwave signal source (e.g., an arbitrary waveform generator), a bias signal source and other components that generate control signals to be delivered to the quantum processor 102. The example control system 110 may include conversion hardware that digitizes response signals received from the quantum processor 102. The digitized response signals may be provided, for example, to a classical processor in the control system 110.

In some cases, the quantum computing system 100 includes multiple quantum processors 102 that operate as respective quantum processor units (QPU). In some cases, each QPU can operate independently of the others. For instance, the quantum computing system 100 may be configured to operate according to a distributed quantum computation model, or the quantum computing system 100 may utilize multiple QPUs in another manner. In some implementations, the quantum computing system 100 includes multiple control systems, and each QPU may be controlled by a dedicated control system. In some implementations, a single control system can control multiple QPUs; for instance, the control system 110 may include multiple domains that each control a respective QPU.

FIG. 2 is a top view of an example integrated circuit system 200. The example integrated circuit system 200 includes qubit devices 202, resonator devices 204 and a ground plane 208 on a substrate 206. The integrated circuit system 200 may include additional or different features, and the components of the integrated circuit system 200 may be arranged as shown or in another manner. The example integrated circuit system 200 can be configured as a quantum processor (e.g., the quantum processor 102 shown in FIG. 1) in a quantum computing system or another type of environment.

The example qubit devices 202 shown in FIG. 2 may include transmon devices, fluxonium devices, other types of qubit devices, or combinations of multiple types of qubit devices. Each of the example qubit devices 202 can be implemented as a nonlinear quantum device made out of a superconductor material and incorporating one or more Josephson junctions. A fixed-frequency qubit device can be implemented, for example, with a single Josephson junction, such that the operating frequency of the qubit device does not vary in response to an applied field. A tunable-frequency qubit device can be implemented, for example, with two Josephson junctions in a circuit loop, such that the operating frequency of the qubit device can be tuned by changing an applied field. In some cases, flux bias lines in the integrated circuit system 200 can be used to change the local magnetic field of each tunable qubit device. The qubit devices 202 are examples of superconducting circuitry that include Josephson junctions. In some implementations, Josephson junctions can be included in other types of devices (e.g., quantum parametric amplifiers, inductors, resonators, etc.) in an integrated circuit system.

The example resonator devices 204 shown in FIG. 2 may include lumped-element microwave devices or other types of resonators. The resonator devices 204 may be implemented, for example, as described in U.S. Publication No. 2017/0148972 or in another manner. The resonator devices 204 are examples of microwave sensing circuitry that can interact with the qubit devices 202. In the example shown in FIG. 2, each resonator device 204 is capacitively coupled to a respective one of the qubit devices 202 and can be used as a readout device, to detect a state of the qubit device 202 to which it is coupled. The integrated circuit system 200 may include other types of microwave sensing circuitry.

The example substrate 206 is made from a low-loss substrate material. For example, the substrate 206 can be a fused silica substrate, a fused quartz substrate, a crystalline quartz substrate, or another type of low-loss $SiO_2$ substrate. In the example shown in FIG. 2, the qubit devices 202, the resonator devices 204, the ground plane 208, and other components of the integrated circuit system 200 each include one or more layers of material (e.g., superconducting material, resistive material, etc.) on the low-loss material of the substrate 206. The use of low-loss substrate material may improve some or all of the components of the integrated circuit system 200 or provide other advantages for the manufacture or operation of a quantum computing system, as described above.

FIG. 3 is a cross-section view of an example integrated circuit system 300. The example integrated quantum circuit system 300 includes a cap wafer 310, a circuit wafer 301, and quantum circuit devices 340 supported on the circuit wafer 301. The integrated circuit system 300 may include additional or different features, and the components of the integrated circuit system 300 may be arranged as shown or in another manner. The example integrated circuit system 300 can be configured as a quantum processor (e.g., the quantum processor 102 shown in FIG. 1) in a quantum computing system or another type of environment.

The example quantum circuit devices 340 may include qubit devices (e.g., the example qubit devices 202 shown in FIG. 2 or another type of qubit device), microwave sensing circuitry (e.g., the example resonator devices 204 shown in FIG. 2 or another type of resonator device), and other types of quantum circuit devices. Moreover, adjacent quantum circuit devices 340 disposed on the circuit wafer 310 can be coupled electromagnetically through a signal line that includes an electrical conductor extending along the surface of the circuit wafer 310 over at least a portion of the distance between the adjacent quantum circuit devices 340. The coupling between the adjacent quantum circuit devices 340 can be capacitive or conductive.

In the example shown in FIG. 3, the circuit wafer 301 and the cap wafer 310 are arranged such that each recess 320 of the cap wafer 310 "caps" or forms an enclosure that houses a respective quantum circuit device 340. The cap wafer 310 includes an electrically conducting layer 350 that covers the interior surface of the recesses 320, and also covers the bonding surface (between the cavities 320) that bonds to the circuit wafer 301. The circuit wafer 301 also includes through-substrate vias 360. The vias 360 include electrically conducting material that extends through the thickness of the circuit wafer 301. One or more of the vias 360 can be connected with a ground plane, for example, to operate as a ground via. One or more of the vias 360 can be connected with a circuit device 340 or a signal line on the surface of the circuit wafer 301, for example, to operate as a signal via.

In some implementations, the conducting layer 350 and the vias 360 are made of superconducting material (e.g., Al, Mo, Nb, NbN, Mo—Re, TiN, In, TaN, etc.). In some implementations, the conducting layer 350 and the vias 360 are made of another type of conducting material (e.g., non-superconducting material) such as copper (Cu), gold (Au), etc. In some implementations, the electrically conducting layer 350 and one or more of the electrically conducting vias 360 are grounded during operation of the integrated circuit system 300.

The cavities can be configured to provide a low-noise operating environment for the quantum circuit devices 340. For example, the sizes (e.g., depth) of the recesses 320 and the material (e.g., superconducting material) of the surface layer 350 can provide electromagnetic isolation. In some cases, the depth (along the "Z" direction) of each recess 320 can be in a range of 5-500 μm (e.g., 20-200 μm), for example, when the thickness of the cap wafer 310 is in a range of 1 μm to 1 mm. The cap wafer 310 may include recesses of another size, shape or material.

The example cap wafer 310 and the example circuit wafer 301 shown in FIG. 3 are made from a low-loss $SiO_2$ substrate material. For example, the cap wafer 310 and the circuit wafer 301 can be made from fused silica substrates, fused quartz substrates, crystalline quartz substrates, or another type of low-loss $SiO_2$ substrates. In some cases, the circuit wafer 301 is made from a low-loss $SiO_2$ material, and the cap wafer 310 is another type of material (e.g., a silicon or sapphire crystal substrate). In the example shown in FIG. 3, the circuit devices 340 each include one or more layers of material (e.g., superconducting material, resistive material, etc.) on the low-loss $SiO_2$ material of the circuit wafer 301; and the vias 360 each include one or more conducting or superconducting paths through the low-loss $SiO_2$ material of the circuit wafer 301. The example cap wafer 310 is bonded to the example circuit wafer 310, and spacers (or standoff bumps) may be used between the bonded cap wafer 310 and circuit wafer 301 in some cases. The use of low-loss $SiO_2$ substrate material may improve some or all of the components of the integrated circuit system 200 or provide other advantages for the manufacture or operation of a quantum computing system, for example, as described above.

FIG. 4 is a top view of an example integrated circuit system 400. The example integrated quantum circuit system 400 includes a cap wafer 410, a circuit wafer 401, circuit devices and signal lines supported on the circuit wafer 401. The footprint of the cap wafer 410 is shown by the dashed line in FIG. 4. The circuit devices include resonator devices (e.g., circuit devices 440A and 440D), qubit devices (e.g., circuit device 440B), and coupler devices (e.g., circuit device 440C); and the circuit devices are operably connected (e.g., capacitively or conductively coupled) by the signal lines (e.g., signal lines 422). The integrated circuit system 400 may include additional or different features, and the components of the integrated circuit system 400 may be arranged as shown or in another manner. The example integrated circuit system 400 can be configured as a quantum processor (e.g., the quantum processor 102 shown in FIG. 1) in a quantum computing system or another type of environment.

The integrated circuit system 400 shown in FIG. 4 may include features of the integrated circuit system 200 shown in FIG. 2, features of the integrated circuit system 300 shown in FIG. 3, or features of both. For example, the qubit devices (e.g., circuit device 440B) and coupler devices (e.g., circuit device 440C) in FIG. 4 may be implemented as described with respect to the example qubit devices 202 in FIG. 2; and the resonator devices (e.g., circuit devices 440A and 440D) in FIG. 4 may be implemented as described with respect to the example resonator devices 204 in FIG. 2. In addition, the cap wafer 410 in FIG. 4 may be implemented as described with respect to the example cap wafer 310 in FIG. 3; the circuit wafer 401 in FIG. 4 may be implemented as described with respect to the example circuit wafer 301 in FIG. 3; and the vias 460 in FIG. 4 may be implemented as described with respect to the example vias 360 in FIG. 3. As described with respect to FIG. 3, the cap wafer 410 or the circuit wafer 401 (or both) in FIG. 4 can be made from a low-loss $SiO_2$ substrate material.

FIG. 4 also shows the footprint of trenches (e.g., trenches 424) defined in the cap wafer 401. In the example shown, the circuit wafer 401 and cap wafer 410 are arranged such that each trench of the cap wafer 410 forms an enclosure that houses a respective signal line. FIG. 4 also shows that the vias 460 are disposed outside of a common footprint of the recesses and trenches encapsulating the quantum circuit devices and signal lines. As shown in FIG. 4, at least a portion of each coupling line is electromagnetically isolated from environmental noise because it is encapsulated by a respective trench defined in the cap wafer 410 and flanked by electrically conducting vias 460 disposed outside the footprint of the trench. Similarly, each quantum circuit device is electromagnetically isolated from environmental noise because it is encapsulated by a respective recess defined in the cap wafer 410 and flanked by electrically conducting vias 460 disposed outside the footprint of the recess.

FIG. 5 is a cross-section view of an example integrated circuit system 500. The integrated circuit system 500 shown in FIG. 5 includes the same components as the integrated circuit system 300 shown in FIG. 3, with the addition of a second circuit wafer 302. As shown in FIG. 5, the second circuit wafer 302 resides between the cap wafer 310 and the first circuit wafer 301.

The second circuit wafer 302 includes electrically conducting vias 360, which are similar to the electrically conducting vias 360 in the first circuit wafer 301. The upper surface of the second circuit wafer 302 supports quantum circuit devices 340 that are housed in the recesses 320 of the cap wafer 310. The upper surface of the second circuit wafer also includes signal lines (which may be housed in trenches) connecting respective pairs of the quantum circuit devices. The lower surface of the second circuit wafer 302 includes recesses 320 and an electrically conducting layer 350, which are similar to the recesses 320 and electrically conducting layer 350 in the cap wafer 310. As shown, the recesses 320 in the second circuit wafer 302 house the quantum circuit devices 340 that are disposed on the first circuit wafer 301.

The example second circuit wafer 302 shown in FIG. 5 is made from a low-loss substrate material, similar to the circuit wafer 301 in FIG. 3. For example, the second circuit wafer 302 can be made from a fused silica substrate, fused quartz substrate, crystalline quartz substrate, or another type of low-loss $SiO_2$ substrate. In some cases, the first and second circuit wafers 301, 302 are made from a low-loss substrate material, and the cap wafer 310 is made from another type of material (e.g., a silicon or sapphire crystal substrate). As shown in FIG. 5, the cap wafer 310 is bonded to the upper surface of the second circuit wafer 302, and the first circuit wafer 301 is bonded to the lower surface of the second circuit wafer 302. In addition, the electrically conducting vias 360 in both circuit wafers (301, 302) and both of the electrically conducting layers 350 (on the cap wafer 301 and the second circuit wafer 302) may be grounded during operation of the integrated circuit system 500 shown in FIG. 5.

FIG. 6 is a cross-section view of an example integrated circuit system 600. The example integrated circuit system 600 includes a qubit circuitry wafer 602 and a sensing circuitry wafer 604. The qubit circuitry wafer 602 is bonded to the sensing circuitry wafer 604 by interconnects 606 (e.g., superconducting solder interconnects, or another type of bond). The integrated circuit system 600 may include additional or different features, and the components of the integrated circuit system 600 may be arranged as shown in FIG. 6 or in another manner.

The example qubit circuitry wafer 602 includes a first substrate 608, a ground plane 610, qubit circuitry 612, and vias 614. The qubit circuitry wafer 602 may include additional or different features. In some implementations, the first substrate 608 is a low-loss material (e.g., fused silica, fused quartz, crystalline quartz, or another type of low-loss $SiO_2$ material). In some implementations, the first substrate 608 is another type of material (e.g., silicon or sapphire crystal material). The ground plane 610 can be a superconducting ground plane, with or without passivation. In the example shown in FIG. 6, the vias 614 are superconducting ground vias, which are connected to the ground plane 610.

The example qubit circuitry 612 can include Josephson junctions and all or part of the quantum circuit devices (e.g., qubit devices, coupler devices, etc.) that contain the Josephson junctions. For example, the qubit circuitry 612 may include qubit devices of the type shown in FIG. 2 (qubit devices 202) or the qubit devices and coupler devices of the type shown in FIG. 4 (e.g., circuit devices 440B, 440C). The example qubit circuitry 612 may include other types of components.

The example sensing circuitry wafer 604 includes a second substrate 618, a ground plane 620, microwave sensing circuitry 622, and vias 624. The sensing circuitry wafer 604 may include additional or different features. In some implementations, the second substrate 618 is a low-loss material (e.g., fused silica, fused quartz, crystalline quartz, or another type of low-loss $SiO_2$ material). The ground plane 620 can be a superconducting ground plane, with or without passivation. In the example shown in FIG. 6, the vias 624 are superconducting ground vias, which are connected to the ground plane 620.

The example sensing circuitry 622 can include microwave circuit components and one or more circuit devices. For example, the qubit circuitry 612 may include resonator devices of the type shown in FIG. 2 (resonator devices 204) or resonator devices of the type shown in FIG. 4 (e.g., circuit devices 440A, 440D). The example sensing circuitry 622 may include other types of components.

In the example shown, the first substrate 608 and the second substrate 618 can be made from the same type of material, or they can be made from different types of material. In the "homogeneous" substrate case, the first substrate 608 and the second substrate 618 can be made of fused silica or fused quartz, for example. In the "heterogeneous" substrate case, the second substrate 618 can be made of fused silica, fused quartz, or another type of low-loss material, and the first substrate 608 can be another type of substrate (e.g., a silicon or sapphire crystal substrate). In this manner the material of each substrate can be optimized for the type of circuitry disposed on the substrate.

FIG. 7 is a cross-section view diagram of an example integrated circuit system 700. The example integrated circuit system 700 shown in FIG. 7 is similar to the integrated circuit system 600, with the addition of multiple layers in the stacked structure. In particular, the example integrated circuit system 700 shown in FIG. 7 includes two qubit circuitry wafers 602 and two sensing circuitry wafers 604. A low-loss material (e.g., fused silica, fused quartz, crystalline quartz, or another type of low-loss $SiO_2$ material) may be used for the substrates of one or more of the circuitry wafers 602 and sensing circuitry wafers 604. The two wafer types are arranged in alternating layers in the vertical stack shown in FIG. 7—the first (bottom) layer is a sensing circuitry wafer 604, the second (intermediate) layer is a qubit circuitry wafer 602, the third (intermediate) layer is another sensing circuitry wafer 604, and the fourth (top) layer is another qubit circuitry wafer 602. In some cases, additional wafers can be arranged in the same alternating fashion to extend the vertical stack further.

In some implementations, one or more wafers in an integrated circuit system include circuitry on both sides of the wafer. For example, the sensing circuitry wafers 604 in FIGS. 6 and 7 may be modified to include microwave sensing circuitry 622 on both sides of the second substrate 618. As another example, the qubit circuitry wafer 602 in FIGS. 6 and 7 may be modified to include qubit circuitry 612 on both sides of the first substrate 608.

In some implementations, one or more of the vias in the integrated circuit systems 600, 700 can be configured as a signal vias, rather than ground vias. For example, vias may carry microwave signals (or other types of electromagnetic signals) between circuit devices on different wafers or on different sides of the same wafer. As another example, vias may carry signals between an external system (e.g., a control system or signal delivery system in a quantum computing system) and the circuit devices in the integrated circuit system (e.g., in a quantum processor of a quantum computing system).

In a general aspect, low-loss materials are used in quantum computing systems.

In some aspects, an integrated circuit system includes qubit circuitry. The qubit circuitry includes one or more Josephson junctions on a substrate. The substrate is made of a low-loss $SiO_2$ material. The low-loss $SiO_2$ material can be, for example, fused quartz, fused silica, or crystalline quartz.

Implementations of these and other aspects may include one or more of the following features. The qubit circuitry may include transmon qubit devices, fluxonium qubit devices, or other types of qubit devices. The integrated circuit system may include microwave sensing circuitry (e.g., resonators, etc.). The microwave sensing circuitry may include one or more microwave circuit components on the substrate made of low-loss $SiO_2$ material. The microwave sensing circuitry may include one or more microwave circuit components on another substrate. The other substrate may be made of low-loss $SiO_2$ material or another material (e.g., silicon or sapphire crystal).

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable subcombination.

A number of implementations have been described. Nevertheless, it will be understood that various modifications can be made.

What is claimed is:

1. An integrated microwave circuit for processing quantum information, the integrated microwave circuit comprising:
 a substrate having a first surface and a second surface opposite the first surface, the substrate formed of a silicon oxide material having a loss tangent no greater than $1 \times 10^{-5}$ at cryogenic temperatures at or below 120 K;
 qubit circuitry disposed on the first surface and comprising a Josephson junction; and
 a ground plane disposed on the first surface or the second surface.

2. The integrated microwave circuit of claim 1, wherein the silicon oxide material is fused silica.

3. The integrated microwave circuit of claim 1, wherein the silicon oxide material is crystalline quartz.

4. The integrated microwave circuit of claim 1, wherein the silicon oxide material has a dielectric constant less than 13 at cryogenic temperatures at or below 120 K.

5. The integrated microwave circuit of claim 1, wherein the silicon oxide material has a resistivity of at least $1 \times 10^{18}$ $\Omega \cdot cm$ at cryogenic temperatures at or below 120 K.

6. The integrated microwave circuit of claim 1, wherein the substrate has a thickness ranging from at least 20 μm to no more than 740 μm.

7. The integrated microwave circuit of claim 1, comprising:
 a qubit device disposed on the first surface;
 a resonator device disposed on the first surface; and
 wherein the qubit device is electromagnetically-coupled to the resonator device.

8. The integrated microwave circuit of claim 7, wherein the qubit device is capacitively-coupled to the resonator device.

9. The integrated microwave circuit of claim 7, wherein the qubit device is conductively-coupled to the resonator device.

10. The integrated microwave circuit of claim 1, wherein the substrate comprises:
 a via extending through the substrate from the first surface to the second surface;
 an electrically-conducting material disposed within the via and extending from the first surface to the second surface; and
 wherein the integrated microwave circuit comprises an electrical pathway between the first and second surfaces, a portion of which, is defined by the electrically-conducting material.

11. The integrated microwave circuit of claim 10, wherein the electrically-conducting material is a superconducting material.

12. The integrated microwave circuit of claim 10, wherein the ground plane is disposed on the second surface and electrically-coupled to the electrically-conducting material.

13. The integrated microwave circuit of claim 1, comprising:
 a cap wafer having a mating surface and comprising:
  a recess disposed within the cap wafer along the mating surface and configured to enclose a portion of the qubit circuitry when the mating surface is coupled to the first surface of the substrate, and
  an electrically-conducting layer disposed over at least a portion of an interior surface of the recess.

14. The integrated microwave circuit of claim 13, wherein the cap wafer is formed of a silicon oxide material.

15. The integrated microwave circuit of claim 13, wherein the electrically-conducting layer is formed of a superconducting material.

16. The integrated microwave circuit of claim 13, wherein the electrically-conducting layer is disposed over the mating surface of the cap wafer.

17. The integrated microwave circuit of claim 1, comprising:
 a resonator device disposed on the second surface;
 wherein the substrate comprises:
  a via extending through the substrate from the first surface to the second surface, and
  an electrically-conducting material disposed within the via and extending from the first surface to the second surface; and wherein the quantum circuit comprises an electrical pathway between the qubit circuitry and the resonator device, a portion of which, is defined by the electrically-conducting material.

18. The integrated microwave circuit of claim 17, wherein the electrically-conducting material is a superconducting material.

19. The integrated microwave circuit of claim 17, comprising a qubit device disposed on the first surface and electromagnetically-coupled to the resonator device on the second surface.

20. The integrated microwave circuit of claim 1, wherein the substrate comprises:
a recess disposed within the substrate along the second surface and comprising an interior surface; and
an electrically-conducting layer disposed over at least a portion of the interior surface.

21. The integrated microwave circuit of claim 20, wherein the electrically-conducting layer is formed of a superconducting material.

22. The integrated microwave circuit of claim 20,
wherein the electrically-conducting layer is disposed over the second surface;
wherein the substrate comprises:
a via extending through the substrate from the first surface to the second surface, and
an electrically-conducting material disposed within the via and extending from the electrically-conducting layer to the first surface; and
wherein the integrated microwave circuit comprises an electrical pathway between the qubit circuitry and the electrically-conducting layer, a portion of which, is defined by the electrically-conducting material.

23. The integrated microwave circuit of claim 22, wherein the electrically-conducting layer is formed of a superconducting material.

24. The integrated microwave circuit of claim 22, wherein the electrically-conducting material is a superconducting material.

25. The integrated microwave circuit of claim 22, wherein the ground plane comprises the electrically-conducting layer.

26. An integrated circuit system, comprising:
a first substrate, comprising:
a first surface and a second surface opposite the first surface,
qubit circuitry disposed along the first surface and comprising a Josephson junction,
a first ground plane disposed along the second surface, and
a first plurality of vias disposed through the first substrate and electrically-coupling the qubit circuitry to the first ground plane;
a second substrate, comprising:
a third surface and a fourth surface opposite the third surface, the third surface oriented to face the first surface of the first substrate,
microwave-sensing circuitry disposed along the third surface and comprising a resonator device,
a second ground plane disposed along the fourth surface, and
a second plurality of vias disposed through the second substrate and electrically-coupling the microwave-sensing circuitry to the second ground plane;
a first plurality of interconnects coupling the first surface to third surface and defining an electrical pathway between the qubit circuitry of the first substrate and the microwave-sensing circuitry of the second substrate; and
wherein at least one of the first substrate or the second substrate are formed of a silicon oxide material having a loss tangent no greater than $1 \times 10^{-5}$ at cryogenic temperatures at or below 120 K.

27. The integrated circuit system of claim 26, wherein the silicon oxide material is fused silica.

28. The integrated circuit system of claim 26, wherein the silicon oxide material is crystalline quartz.

29. The integrated circuit system of claim 26, wherein the silicon oxide material has a dielectric constant less than 13 at cryogenic temperatures at or below 120 K.

30. The integrated circuit system of claim 26, wherein the silicon oxide material has a resistivity of at least $1 \times 10^{18}$ Ω·cm at cryogenic temperatures at or below 120 K.

31. The integrated circuit system of claim 26, wherein the substrate has a thickness ranging from at least 20 μm to no more than 740 μm.

32. The integrated circuit system of claim 26, comprising:
a second plurality of interconnects coupled to the fourth surface and electrically-coupled to one or both of the second ground plane and the second plurality of vias.

33. The integrated circuit system of claim 26,
a second plurality of interconnects coupled to the fourth surface and electrically-coupled to one or both of the second ground plane and the second plurality of vias;
wherein the first substrate, the second substrate, the first plurality of interconnects, and the second plurality of interconnects define a stacked unit in a plurality of stacked units; and
wherein the second plurality of interconnects couples the fourth surface to the second surface between adjacent stacked units.

34. The integrated circuit system of claim 33, wherein the second plurality of interconnects is electrically-coupled to the second ground plane of the second substrate.

* * * * *

UNITED STATES PATENT AND TRADEMARK OFFICE
CERTIFICATE OF CORRECTION

PATENT NO. : 10,535,809 B1
APPLICATION NO. : 16/116481
DATED : January 14, 2020
INVENTOR(S) : Vodrahalli Page 1 of 1

It is certified that error appears in the above-identified patent and that said Letters Patent is hereby corrected as shown below:

On the Title Page

Page 2, Column 1, item (56) Other Publications, delete "SiO2" and insert -- $SiO_2$ -- therefor.

In the Specification

Column 2, Line 48, delete ""heterogeneus"" and insert -- "heterogeneous" -- therefor.

Column 3, Line 33, delete "homogenous," and insert -- homogeneous, -- therefor.

Column 7, Line 30, delete "310" and insert -- 301 -- therefor.

Column 7, Line 33, delete "310" and insert -- 301 -- therefor.

Column 8, Line 20, delete "310," and insert -- 301, -- therefor.

Column 8, Line 65, delete "401." and insert -- 410. -- therefor.

Column 9, Line 51, delete "301" and insert -- 310 -- therefor.

Signed and Sealed this
Twenty-first Day of July, 2020

Andrei Iancu
*Director of the United States Patent and Trademark Office*